(12) United States Patent
Liao

(10) Patent No.: US 8,576,005 B2
(45) Date of Patent: Nov. 5, 2013

(54) TRANSCEIVER AND INTEGRATED CIRCUIT

(75) Inventor: Chih-Fan Liao, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 14 days.

(21) Appl. No.: 13/309,474

(22) Filed: Dec. 1, 2011

(65) Prior Publication Data
US 2013/0009704 A1 Jan. 10, 2013

Related U.S. Application Data

(60) Provisional application No. 61/504,551, filed on Jul. 5, 2011.

(51) Int. Cl.
*H03F 3/45* (2006.01)
(52) U.S. Cl.
USPC ............................................ 330/253; 330/301
(58) Field of Classification Search
USPC ............... 330/301, 283, 252–261; 333/25–26
See application file for complete search history.

(56) References Cited

U.S. PATENT DOCUMENTS 8,073,417 B2 * 12/2011 Chang et al. ................... 455/280

OTHER PUBLICATIONS

Lee, C.P., et al.; "A MultiStandard, Multiband SOC with Integrated BT FM, WLAN Radios and Integrated Power Amplifier;" IEEE International Solid-State Circuits Conference; 2010; pp. 454-456.
Beffa, F., et al.; "A Receiver for WCDMA/EDGE Mobile Phones with Inductorless Front-end in 65nm CMOS;" IEEE International Solid-State Circuits Conference; 2011; pp. 370-372.
Mirzaie, A., et al.; "A 65nm Quad-Band SAW-Less Receiver for GSM/GPRS/EDGE;" Symposium on VLSI Circuits/Technical Digest of Technical Papers; 2010; pp. 179-180.

* cited by examiner

*Primary Examiner* — Hieu Nguyen
(74) *Attorney, Agent, or Firm* — McClure, Qualey & Rodack, LLP

(57) ABSTRACT

An integrated circuit is disclosed, including a balun, a transistor pair, and a degeneration inductor winding. The balun has an outer boundary, and comprises a primary winding and a secondary winding. The primary winding is adapted to receive an input signal. The secondary winding is magnetically coupled to the primary winding, and adapted to convert the input signal into a differential form. The transistor pair is connected to the secondary winding and adapted to amplify the input signal. The degeneration inductor winding is connected to the transistor pair and located within the outer boundary of the balun.

20 Claims, 3 Drawing Sheets

TRANSCEIVER AND INTEGRATED CIRCUIT

CROSS REFERENCE TO RELATED APPLICATIONS

This application claims priority of U.S. Provisional Application No. 61/504,551, filed on Jul. 5, 2011, and the entirety of which is incorporated by reference herein.

BACKGROUND OF THE INVENTION

1. Field of the Invention

The present invention relates to telecommunications, and in particular relates to a circuit layout for transceiver circuitry.

2. Description of the Related Art

A balun is a wideband transformer used in RF communication systems to transform RF signals between an unbalanced system and a balanced system, thereby connecting the unbalanced system such as such as an antenna or a coaxial cable to a balanced system such as the differential amplifiers. Since the balun occupies a place between the antenna and the radio transceiver, it increases the PCB area and cost, especially in multiband and multimode transceivers where several baluns are required. Advances in system-on-a-chip (SOC) technology have enabled the integration of the balun in conjunction with other RF and baseband circuitries in a single integrated circuit (IC). This simplifies the design of PCB and reduces the cost of the entire module.

BRIEF SUMMARY OF THE INVENTION

In one aspect of the invention, an integrated circuit is disclosed, comprising a balun, a transistor pair, and a degeneration inductor winding. The balun has an outer boundary, and comprises a primary winding and a secondary winding. The primary winding is adapted to receive an input signal. The secondary winding is magnetically coupled to the primary winding, adapted to convert the input signal into a differential form. The transistor pair is connected to the secondary winding and adapted to amplify the input signal. The degeneration inductor winding is connected to the transistor pair and located within the outer boundary of the balun.

In another aspect of the invention, a transceiver is provided, comprising a balun and a receiver. The balun has an outer boundary, and comprises a primary winding and a secondary winding. The primary winding is adapted to receive an input signal. The secondary winding is magnetically coupled to the primary winding, adapted to convert the input signal into a differential form. The receiver comprises a differential amplifier and a source degeneration inductor. The differential amplifier is adapted to connect to the secondary winding and amplify the input signal. The source degeneration inductor is connected to the differential amplifier, located within the outer boundary of the balun.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

A detailed description is given in the following embodiments with reference to the accompanying drawings. Certain embodiments of the invention may be found in a method and system for an integrated circuit (IC) configurable RF front end with an on-chip balun and a low noise amplifier using a source degeneration inductor. The balun, the low noise amplifier, and the source degeneration inductor may be fabricated on one or more layers of the single IC. The IC may further comprise various devices such as inductors, capacitors, resistors, transistors, switches, a microstrip, or any other component that can be fabricated thereon. The IC is configured for receiving RF signals and/or transmitting RF signals for a telecommunication system or a personal communication system such as a Wireless Local Area network (WLAN), a Global System for Mobile Communications (GSM) network, a General Packet Service (GPRS) network, a Universal Mobile Telecommunication System (UMTS) network, a Long Term Evolution (LTE) network, or a combination thereof. The telecommunication system or the personal communication system may be implemented using a frequency division duplexing (FDD) or time division duplexing (TDD) technique. In the FDD system, wireless communication devices communicate to one another through uplink and downlink communication at different frequencies. In the TDD system, wireless communication devices communicate to one another through uplink and downlink communication at different time, typically by asymmetrical uplink and downlink data rates. The wireless communication device may be a user equipment, a mobile station, an access point, or even a base station. The user equipment may be a handheld mobile phone, a personal digital assistant with wireless communication capability, a laptop or personal computer equipped with a broadband network adaptor, or any other device capable of wireless communication.

Figure 1:
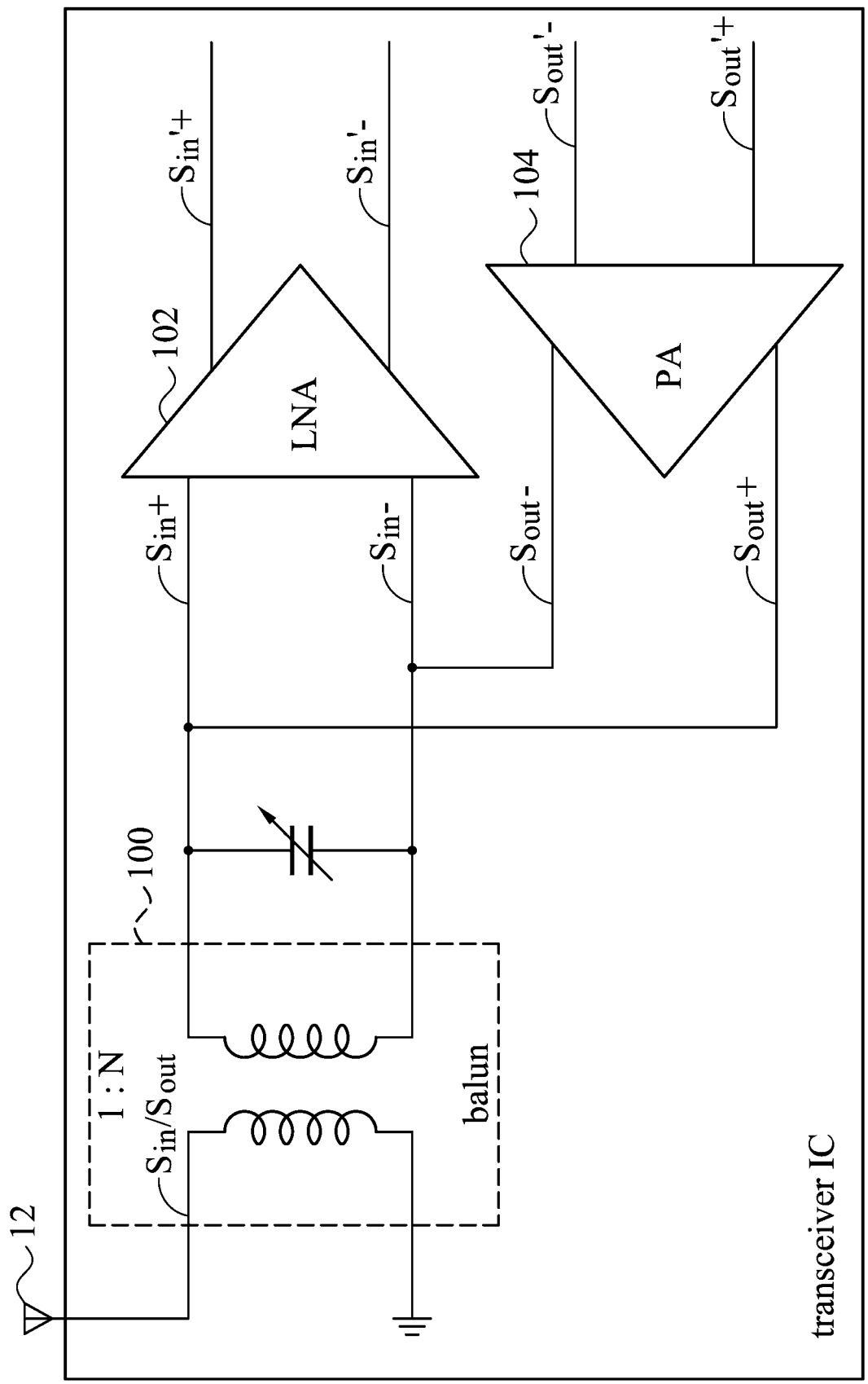
FIG. 1 is a system diagram of a wireless communication system 1 according to one embodiment of the invention.

FIG. 1 is a block diagram of an exemplary transceiver IC 10 according to an embodiment of the invention, comprising a balun 100, a low noise amplifier (LNA) 102, and a power amplifier (PA) 104. The transceiver IC 10 integrates the balun 100, the LNA 102, and the PA 104 thereon to perform analog signal processing, as well as a baseband module (not shown) to carry out digital signal processing. The transceiver IC 10 can be incorporated in the wireless communication device, allowing outgoing and incoming data transmission via a single antenna 12, which may be on-chip or off-chip. In the case of the on-chip antenna, the antenna 12 may be implemented by a microstrip pattern printed on the IC 10, whereas for the off-chip antenna, the antenna 12 may be attached to the transceiver IC 10 through an unbalanced feedline such as a coaxial cable, a microstrip, or a stripline. The antenna 12 may be balanced or unbalanced. A balanced antenna is not directly connected to ground or earth and is balanced about the ground or earth, whereas an unbalanced antenna comprises one conductor directly connecting to the ground or earth. The balanced antenna may be a folded dipole and the unbalanced antenna may be a monopole. During transmission, the PA 104 performs power amplification to an outgoing RF signal $S_{out}\pm$ to drive the antenna 12 for outgoing transmission. During reception, the LNA 102 amplifies an incoming RF signal $S_{in}\pm$ detected by the antenna 12 while adding little or no noise and distortion to the amplified incoming signal $S_{in}\pm'$. The LNA 102 and the PA 104 are coupled to the antenna 12 through the balun 100, which converts an electronic signal between an unbalanced and balanced form, thereby connecting an unbalanced circuit (the antenna 12 or the unbalanced feedline) to a balanced circuit (the LNA 102 or the PA 104). The transceiver IC 10 may also comprise a transmit/receive (TR) switch (not shown) and a baseband module (not shown). The TR switch isolates the LNA 102 from the PA 104 during transmission and disconnects the PA 104 from the LNA 102 during reception. The baseband module generates the outgoing digital signals to the PA 104 during transmission to process incoming digital signals from the LNA 102 during reception.

The balun 100 is coupled between an unbalanced circuit (an antenna or a coaxial cable) and a balanced circuit (LNA 102 and PA 104) to transform signals between the forms of unbalanced (single-ended) signals and balanced (differential) signals, i.e., converting an incoming RF signal $S_{in}$ from the single-ended into the differential form and converting an outgoing RF signal from the differential into the single-ended form. The differential forms of the incoming and outgoing RF signals are represented by $S_{in}\pm$ and $S_{out}\pm$ respectively. The differential pair of signals comprises two complementary signals sent on two separate wires, and enables wanted signal properties such as common mode rejection, increased noise immunity, and reduced electromagnetic interference. In some implementations, the balun 100 is capable of impedance transformation as well as gain transformation. For examples, a 4:1 balun provides the impedance transformation by a ratio of 16:1, i.e., converting 800 ohms impedance into 50 ohms, and a 1:2 balun provides the gain transformation by a ratio of 1:2.

The LNA 102 amplifies the incoming RF signal $S_{in}\pm$ by an amplification gain while introducing little or no noise and distortion to the amplified RF signal $S_{in}\pm'$, so that power loss in the receiving path is reduced, and noise generated by successive circuit stages has little impact on a signal-to-noise ratio (SNR) for the incoming RF signal $S_{in}\pm$. The LNA 102 has a low noise figure, sufficient gain, wide operating bandwidth, high linearity, stability, and low input and output voltage standing wave ratios (VSWR). The LNA 102 provides little or substantially no degradation on the SNR, represented by a noise figure. The LNA 102 is placed in close proximity to the antenna 18 and the balun 100 and has high amplification in a first amplification stage thereof, to reduce signal losses of the received signal $S_{in}\pm$ in a receiving path between the antenna 18 and the LNA 102 and provide a low noise figure to the amplified incoming RF signal $S_{in}\pm'$. Further, the LNA 102 is positioned at a distance to a digital clock employed for the digital processing in the baseband module, thereby reducing signal interference from the digital clock.

The amplified RF incoming signal $S_{in}\pm'$ is transferred to a receiver front end (not shown) including a mixer, a filter, and analog-to-digital converter, where filtering processes, down-conversion, and analog to digital conversion is performed to output the digital baseband signal for the digital processing in the baseband module. The demodulation frequency for the down-conversion is defined by the communication standard to which the wireless communication device adopts.

The LNA 102 can be implemented by a common source, common emitter, or cascode configuration, and employ inductive source degeneration for the input matching purposes. The inductive source degeneration is to provide a means to generate the real part of the impedance for the input impedance matching, so that when looking into the gate or base terminal a real part of the impedance can be observed. The gain is then determined by the device unity-gain frequency, the impedance at the interface between the LNA and balun, and the load impedance.

The amplifier configuration is a transconductance amplifier, which amplifies and converts the input RF signal $S_{in}\pm$ into a current form. With a passive mixer directly connected to the transconductance amplifier, this configuration forms a current mode interface and provides wanted circuit properties such as increased speed in the signal processing at radio frequency and increased linearity.

During the transmit process, an outgoing digital signal is outputted to a transmitter front end (not shown) for analog conversion, up-conversion, and other filtering processes, where the signal is transformed into an analog form, up-converted to a radio frequency (RF), and removed of unwanted signal components, before transferring the outgoing radio frequency signal $S_{out}\pm$ to the PA 104, which then increases power output levels of the outgoing RF signal $S_{out}\pm$ to a predetermined power range or a predetermined power level that may be assigned by the service network. The PA 104 has high efficiency, high gain, high output power compression (P1dB), good return loss on an input and output thereof, and low heat dissipation. The modulation frequency for the up-conversion is defined by the communication standard to which the wireless communication device adopts.

Figure 2:
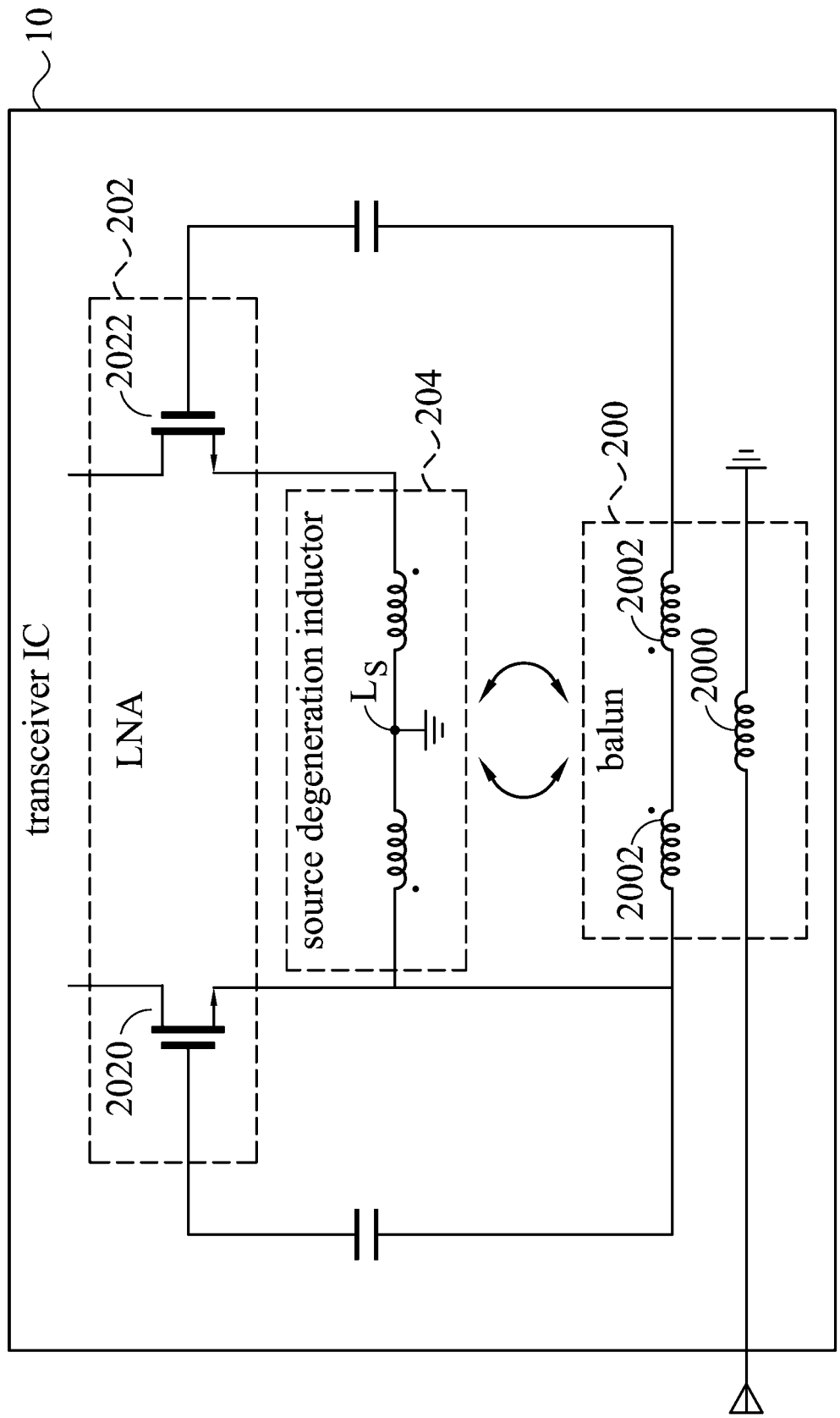
FIG. 2 is a block diagram of a radio transceiver integrated circuit (IC) 2 according to an embodiment of the invention.

FIG. 2 is a circuit schematic of a transceiver IC 10 according to an embodiment of the invention, comprising a balun 200, a LNA 202, a pair of source degeneration inductors 204.

The balun 200 comprises a primary winding 2000 and secondary winding 2002, converting the incoming RF signal $S_{in}$ (input signal) detected by the antenna 12 into a pair of differential signal, wherein each is 180 degrees out-of-phase to another. The primary winding 2000 is an unbalanced structure, connected to the antenna 12 to obtain the RF signal $S_{in}$. The secondary winding 2002 is a balanced structure, magnetically coupled to the primary winding 2000, adapted to convert the incoming RF signal $S_{in}$ into a differential form, and output the differential pair of the incoming RF signal $S_{in}\pm$ to the LNA 202. The secondary winding 2002 may be an inductor with a middle thereof connected to the ground or to a reference voltage level. The primary winding 2000 and secondary winding 2002 may have a turn ratio of 1:1 to simply provide differential signal conversion. The primary winding 2000 and secondary winding 2002 may have a turn ratio of 1:N to provide voltage gain or impedance transformation. In some implementations, the top two layers of the transceiver IC 10 are used for the primary winding 2000 and secondary winding 2002. Both the primary winding 2000 and secondary winding 2002 are symmetrically wound with the windings on the two layers being connected in parallel and having a finite space in the center of the windings. The balun 200 occupies a finite area on the IC 10, comprising an outer boundary and an inner boundary encircling the spacing of the center.

The LNA 202 is fully differential, and comprises a transistor pair including a first transistor 2020 and a second transistor 2022. The LNA 202 is source degenerated to provide a resistive component for the input matching. The transistors 2020 and 2022 are MOSFET transistors connected in a common source configuration. The transistors 2020 and 2022 receive the differential inputs of the incoming RF signal respectively at the gate terminals from the secondary winding 2002 to yield amplified output currents at the drain terminals. The amplification gain is determined by the unity-gain frequency of the transistors 2020 and 2022, which is proportional to the transconductance and inversely proportional to the gate-source capacitance. The input impedance is affected by the gate-to-source capacitance so that additional tuning components are utilized to reduce or resonate out the input capacitance. In some implementations, one or more gate inductors are incorporated as the tuning component before the gate terminal to reduce or resonate out the input capacitance, resulting in a more purely resistive input for the LNA 202, which is provided by the source degeneration inductors 204. The transistors 2020 and 2022 are connected to the source degeneration inductors 204 at the source terminals thereof. The source degenerated LNA 102 is connected to a passive mixer and has a low-impedance interface between the LNA 204 and the mixers.

The source degeneration inductor 204 is a spiral-shaped structure, comprising three terminals, with one terminal connected to the ground and the other two terminals to the source terminals of the transistors 2020 and 2022 respectively, to introduce a real part in the input impedance without the contribution of additional noise. Since the common source LNA 202 ideally has no input resistance, only input capacitance, the source degeneration inductor 204 provides a resistive component to match with the characteristic impedance of a transmission line, typically 50 ohms Therefore the inductance value of the source degeneration inductor 204 is determined by the required resistive component in the input matching. The source denegation inductor 204 is placed within the inner or outer boundary of the balun and encompassed by the balun 200. As a change in the current in the balun 200 occurs, a mutual inductance is induced, providing additional inductance to the source degeneration inductor 204. Therefore, self-inductance $L_s$ of the source degeneration inductor 204 can be reduced while providing the required inductance for the input impedance matching.

The embodiment illustrates a common source amplifier with source degeneration as the LNA, which places the source degeneration inductor 204 within the outer or inner boundaries of the balun 200 to reduce the required self-inductance of the degeneration inductor 204, allowing a decrease in the physical size of the inductor winding and circuit size of the IC, which reduces manufacturing costs, while providing wideband input impedance matching with low noise, and allowing a current mode interface to the succeeding circuit stage.

Although the amplifier transistors 2020 and 2022 employ MOSFET transistors in common source configuration in the embodiment, the person skilled in the art will recognize that amplifier transistors may be realized by BJT transistors and may be connected in a cascode or multistage configuration, and appropriate changes may be made to the transceiver circuit 2 without deviating from the principle of the invention.

Figure 3:
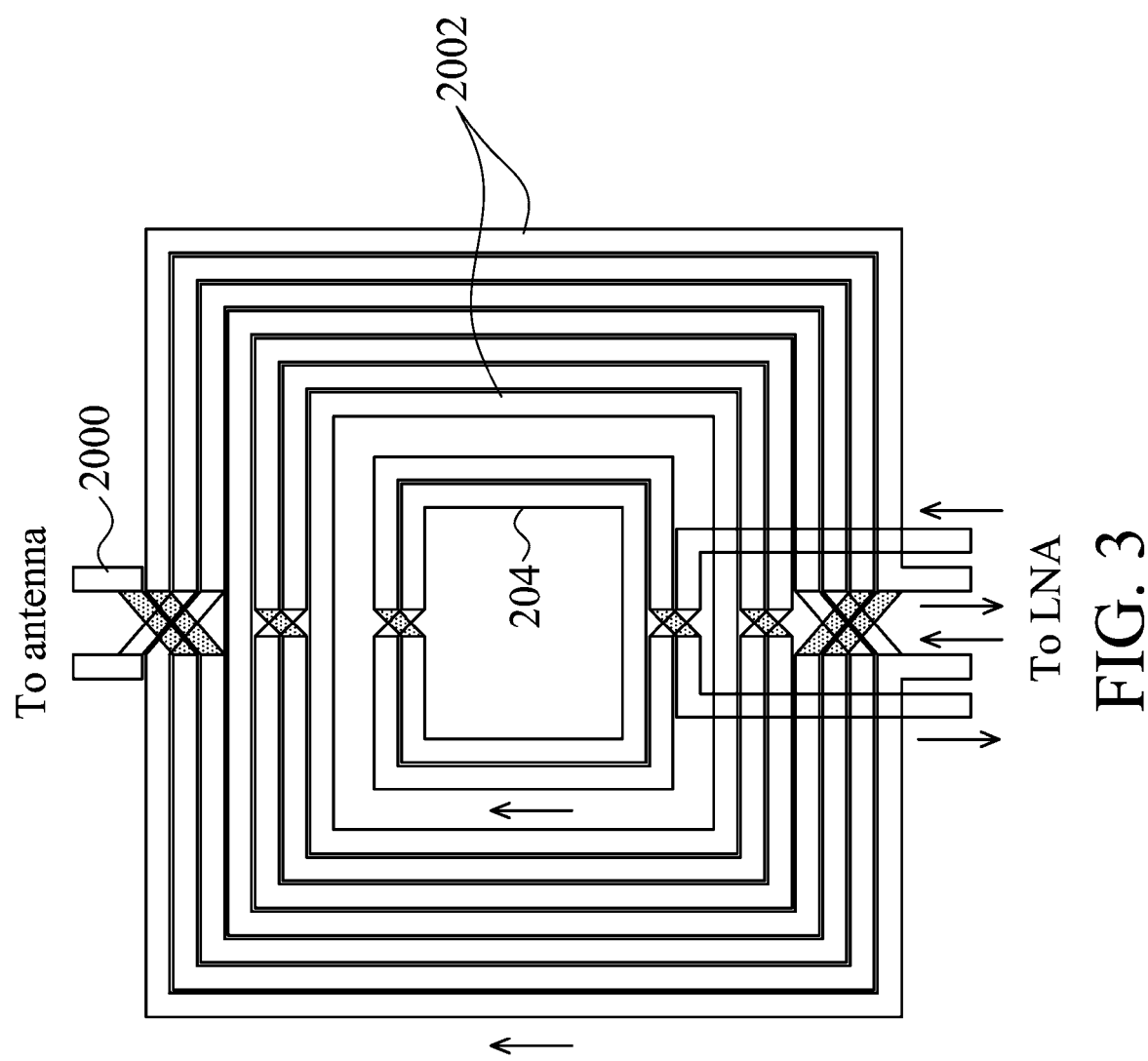
FIG. 3 is a block diagram of a radio transceiver IC 3 according to another embodiment of the invention.

FIG. 3 illustrates a layout placement of the primary winding 2000, the secondary winding 2002 and the source degeneration inductor 204 according to an embodiment of the present invention.

The primary winding 2000 and secondary winding 2002 are realized by two spiral microstrip patterns. The balun 200 is implemented by interwinding the two spiral patterns to each other on one or more layers of the transceiver IC 10. The primary winding 2000 is an unbalanced structure, with one end connected to the antenna 12 to accept the incoming RF signal $S_{in}$ and the other end connected to the ground. The secondary winding 2022 is a balanced structure, magnetically coupled to the primary winding 2000, adapted to convert the incoming RF signal $S_{in}$ into a differential form, and output the differential pair of the incoming RF signal $S_{in}\pm$ to the LNA 202. In some implementations, the top two layers of the transceiver IC 10 are used for the primary winding 2000 and secondary winding 2002. Both the primary winding 2000 and secondary winding 2002 are symmetrically wound with the windings on the two layers being connected in parallel and a finite space being in the center of the windings. The balun 200 occupies a finite area on the IC 10, comprising an outer boundary and an inner boundary encircling the space in the center. In the embodiment in FIG. 3, the turn ratio of the primary to the secondary windings is 2:5, and both the outer and inner boundaries are defined by the secondary winding 2002.

The source degeneration inductor 204 is implemented by a spiral winding on the IC 10, comprising three terminals, with one terminal thereof in the middle of the spiral winding and the other two terminals at substantially a same distance from the middle terminal. The middle terminal is connected to the ground and the other two terminals are connected to the source terminals of the transistors 2020 and 2022 respectively, to introduce a real part in the input impedance without the contribution of additional noise. The source degeneration inductor 204 occupies a finite area on the transceiver IC 10, fabricated on the empty space encompassed by the balun 200 to reduce transceiver circuit size and decrease manufacturing costs. The source degeneration inductor 204 may be implemented on one or more layers of the IC 10 and on same or different layers from which the balun 200 is on. In some implementations, the source degeneration inductor 204 is placed inside of the inner boundary of the balun 200. In other implementations, the source degeneration inductor 204 is placed within the outer boundary of the balun 200. Specifically, the source degeneration inductor 204 is placed adjacent to the secondary winding 2002, such that the source degeneration inductor 204 has one turn in parallel to the secondary winding 2002 and a finite spacing remains between the parallel turns. The spacing between the parallel turns is such that a mutual inductance can be induced by the adjacent secondary winding 2002 and may be, for example, in a range of 5 to 10 micro meters. The currents flowing in secondary winding 2002 has a same direction as in the source degeneration inductor 204, therefore producing a magnetic flux which further forms magnetic coupling to the source degeneration inductor 204 by a magnetic coupling factor k and induces a current in a same direction as the current in the source degeneration inductor 204, thereby increasing the total current and hence the inductance. The mutual inductance and the self inductance $L_s$ of the source degeneration inductor 204 can be combined to render the required inductance for the input matching purpose, thereby reducing the self inductance $L_s$ in comparison to the conventional layout approach.

Although the turn ratio of the primary winding 2000 to the secondary winding 2002 on FIG. 3 is 2:5, people in the art will recognize that other turn ratios can be implemented without deviating from the principle of the invention.

The embodiment depicts a physical layout of a common source amplifier with inductive source degeneration, by placing the source degeneration inductor 204 within the outer or inner boundaries of the balun 200 to reduce the required self-inductance of the source degeneration inductor 204, allowing a decrease in the physical size of the inductor winding and circuit size of the IC, and reduction in manufacturing costs, while providing wideband input impedance matching, low output impedance, and current mode interface to the succeeding circuit stage.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

While the invention has been described by way of example and in terms of the preferred embodiments, it is to be understood that the invention is not limited to the disclosed embodiments.

To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit, comprising:
a balun, having an outer boundary, comprising:
a primary winding, adapted to receive an input signal; and
a secondary winding, magnetically coupled to the primary winding, adapted to convert the input signal into a differential form;
a transistor pair, connected to the secondary winding, adapted to amplify the input signal; and
a source degeneration inductor comprising a degeneration inductor winding, connected to the transistor pair, located within the outer boundary of the balun, wherein the degeneration inductor winding is formed such that a mutual inductance between the degeneration inductor winding and the secondary winding, whereby current flowing in the secondary winding has a direction the same as current flowing in the degeneration inductor winding.

2. The integrated circuit of claim 1, wherein the balun further has an inner boundary, and the degeneration inductor winding is further encompassed by the inner boundary of the balun.

3. The integrated circuit of claim 1, wherein each of the secondary winding and the degeneration inductor winding has one turn in parallel to each other, and the parallel turns of the secondary winding and the degeneration inductor winding have a spacing therebetween.

4. The integrated circuit of claim 3, wherein the spacing is determined according to a magnetic coupling factor k between the secondary winding and the degeneration inductor winding.

5. The integrated circuit of claim 3, wherein the spacing is in a range of 5 to 10 micro meters.

6. The integrated circuit of claim 3, wherein the spacing is arranged to increase a magnetic coupling effect between the secondary winding and the degeneration inductor winding.

7. The integrated circuit of claim 3, wherein the parallel turns of the secondary winding and the degeneration inductor winding are adjacent to each other.

8. The integrated circuit of claim 3, wherein the source degeneration inductor is implemented by a spiral winding, comprising three terminals, with one terminal thereof in the middle of the spiral winding and the other two terminals at substantially a same distance from the middle terminal, wherein the middle terminal is connected to ground and the other two terminals are connected to source terminals of the transistors of the transistor pair, wherein the source degeneration inductor is fabricated on the empty space encompassed by the balun.

9. The integrated circuit of claim 8, wherein the flowing currents are capable of enhancing an inducting effect of the degeneration inductor winding.

10. The integrated circuit of claim 1, wherein the balun and the degeneration inductor winding are on a same layer in the IC.

11. The integrated circuit of claim 1, wherein the balun and the degeneration inductor winding are on different layers in the IC.

12. The integrated circuit of claim 1, wherein the degeneration inductor winding comprises three terminals, with one terminal thereof being connected to ground, and the other two being connected to the transistor pair.

13. The integrated circuit of claim 1, wherein the transistor pair is a MOS transistor pair, the secondary winding is connected to gate terminals of the MOS transistor pair, the degeneration inductor winding is connected to source terminals of the MOS transistor pair.

14. The integrated circuit of claim 1, wherein the first and the second winding comprise different numbers of turns, and the balun is adapted to provide a voltage gain to the input signal.

15. A transceiver, comprising:
a balun, having an outer boundary, comprising:
a primary winding, adapted to receive an input signal; and
a secondary winding, magnetically coupled to the primary winding, adapted to convert the input signal into a differential form; and
a receiver, comprising:
a differential amplifier, adapted to connect to the secondary winding and amplify the input signal; and
a source degeneration inductor, connected to the differential amplifier, located within the outer boundary of the balun, wherein the source degeneration inductor is formed such that a mutual inductance between the source degeneration inductor and the secondary winding, whereby current flowing in the secondary winding has a direction the same as current flowing in the source degeneration inductor.

16. The transceiver of claim 14, further comprising a transmitter, adapted to amplify an output signal, wherein the balun is further adapted to convert the output signal into a single-ended form.

17. The transceiver of claim 14, wherein the balun further has an inner boundary, and the source degeneration inductor is further encompassed by the inner boundary of the balun.

18. The transceiver of claim 14, wherein each of the secondary winding and the degeneration inductor has one turn in parallel to each other, and the parallel turns of the secondary winding and the degeneration inductor winding have a spacing therebetween.

19. The transceiver of claim 18, wherein the spacing is arranged to increase a magnetic coupling effect between the secondary winding and the degeneration inductor.

20. The transceiver of claim 15, wherein the source degeneration inductor is implemented by a spiral winding, comprising three terminals, with one terminal thereof in the middle of the spiral winding and the other two terminals at substantially a same distance from the middle terminal, wherein the middle terminal is connected to ground and the other two terminals are connected to source terminals of the transistors of the transistor pair, wherein the source degeneration inductor is fabricated on the empty space encompassed by the balun.

* * * * *